United States Patent [19]

Abe

[11] Patent Number: 5,639,009

[45] Date of Patent: Jun. 17, 1997

[54] APPARATUS AND METHOD FOR MOUNTING TAPE CARRIER PACKAGE ONTO LIQUID CRYSTAL DISPLAY

[75] Inventor: Toshiki Abe, Fukuoka, Japan

[73] Assignee: Matsushita Electric Industrial Co., Ltd., Osaka, Japan

[21] Appl. No.: 540,826

[22] Filed: Oct. 11, 1995

[30] Foreign Application Priority Data

Oct. 21, 1994 [JP] Japan ................................ 6-256804

[51] Int. Cl.⁶ .................................................. B23K 37/04
[52] U.S. Cl. ............................ 228/102; 228/6.2; 228/105
[58] Field of Search ................................ 228/102, 105, 228/6.2, 9

[56] References Cited

U.S. PATENT DOCUMENTS 5,042,709  8/1991  Cina et al. ............................ 228/105
5,119,436  6/1992  Holdgrafer ........................... 228/105

Primary Examiner—Kenneth J. Ramsey
Attorney, Agent, or Firm—Pollock, Vande Sande & Priddy

[57] ABSTRACT

An LCD 1 is evacuated from the focus range of the camera 4 in a horizontal direction, while a positioning object 18 on a TCP 17 is placed in the focus range of the visual field of the camera 4 to obtain a dislocation of the TCP 17 by monitoring the positioning object 18. The TCP 17 is then lifted in a vertical direction keeping its horizontal position until it goes out of the focus range of the camera 4. The LCD 1 is returned in the horizontal direction so that a positioning object 2 on the LCD 1 comes into the focus range of the camera 4. Then, a dislocation of the LCD 1 is detected by monitoring the positioning object 2. A mutual positional relation is corrected by shifting at least either the LCD 1 or the TCP 17 in the horizontal direction based on the detected dislocations of the positioning objects 2 and 18. Finally, the TCP 17 is lowered keeping its horizontal position, and mounted on the LCD 1.

15 Claims, 4 Drawing Sheets

APPARATUS AND METHOD FOR MOUNTING TAPE CARRIER PACKAGE ONTO LIQUID CRYSTAL DISPLAY

BACKGROUND OF THE INVENTION

1. Field of the Invention

This invention relates to an apparatus and a method for mounting a tape carrier package onto a liquid crystal display.

2. Prior Art

Before mounting a TCP (Tape Carrier Package) onto an LCD (liquid crystal display), the positional relationship between the TCP and LCD is monitored by a camera. And, if any positional dislocation is found between them, it is necessary to eliminate such a dislocation. In general, the LCD and TCP are provided with numerous thin electrodes and leads arrayed along the sides thereof at very small pitches. The number of such electrodes and leads will range from several tens to several hundreds. Thus, the mounting of these LCD and TCP requires an extremely high accuracy in X and Y directions.

As a method for monitoring the mutual positional relation between a TCP and an LCD, there are known the following two methods.

A first method uses a camera whose visual field is stationarily fixed for assuring accuracy in the recognition of these components. The LCD and the TCP are supported movable in the X-Y direction (i.e. along a horizontal plane). Then, the LCD and the TCP come in the visual field of the camera but they are not overlapped. Under this condition, a mutual positional dislocation is obtained through image analysis. Thereafter, both are shifted to correct the mutual relation. Then, the mounting operation is performed by overlapping the TCP onto the LCD.

A second method is carried out in the following manner. First, a TCP and an LCD are overlap each other with a very small gap, so that the mounting operation is soon accomplished by lowering the TCP onto the LCD by a very small distance. This overlapped condition is monitored by a camera to detect a dislocation between the TCP and the LCD.

However, it is usual that anisotropic conductive tapes are attached on electrodes of the LCD to adhesively bond the electrodes to the leads of the TCP. Thus, these anisotropic conductive tapes and the LCD itself may become obstacles when the leads of the LCD are monitored by the camera according to the above first and second methods. Thus, there is the possibility that these first and second methods may fail to obtain a clear image of the TCP, and therefore the detected position of the TCP may be inaccurate, resulting in deterioration of accuracy in the mounting operation. If the obtained image is unclear, the image analysis will encounter with errors so frequently that the mounting operation of the TCP is substantially stopped or suspended.

SUMMARY OF THE INVENTION

Accordingly, in view of above-described problems encountered in the prior art, a principal object of the present invention is to provide a method and an apparatus for assuring an excellent accuracy in the mounting operation of a tape carrier package onto a liquid crystal display.

In order to accomplish this and other related objects, a first aspect of the present invention provides a method for mounting a tape carrier package onto a liquid crystal display, wherein a first positioning object on the tape carrier package and a second positioning object on the liquid crystal display are monitored by a camera, and the tape carrier package is mounted onto the liquid crystal display after correcting a positional relationship between the tape carrier package and the liquid crystal display. The method comprises: a first step of detecting a first positional data representing a position of the tape carrier package based on a monitoring of the first positioning object, the first positioning object of the tape carrier package coming in a focus range of a visual field of the camera after a liquid crystal display is removed out of the visual field of the camera in a horizontal direction; a second step of detecting a second positional data representing a position of the liquid crystal display based on a monitoring of the second positioning object, the liquid crystal display being shifted in the horizontal direction in such a manner that the second positioning object comes into the focus range of the visual field of the camera after the tape carrier package is lifted upward in a vertical direction until the tape carrier package goes out of the focus range of the camera; a third step of comparing an actual mutual position with a predetermined ideal position based on the first and second positional data, thereby correcting a mutual positional relationship between the tape carrier package and the liquid crystal display in the horizontal direction; and a fourth step of mounting the tape carrier package onto the liquid crystal display.

In the above first aspect mounting method, it is desirable that the liquid crystal display is held by an X-Y table and shifted in the horizontal direction by the X-Y table, and the tape carrier package is held by a Z-axis motor shiftable in the vertical direction. The first positioning object on the tape carrier package is a lead or a mark provided on the tape carrier package. The second positioning object on the liquid crystal display is an electrode or a mark provided on the liquid crystal display.

A second aspect of the present invention provides a method for mounting a tape carrier package onto a liquid crystal display comprising steps of: providing a first positioning object on a tape carrier package and a second positioning object on a liquid crystal display; evacuating a liquid crystal display out of a visual field of a camera in a horizontal direction; shifting the tape carrier package until the first positioning object comes in a focus range of the visual field of the camera; detecting a first positional data representing a position of the tape carrier package based on a monitoring of the first positioning object; lifting the tape carrier package upward in a vertical direction until the tape carrier package goes out of the focus range of the camera; shifting the liquid crystal display in the horizontal direction so that the second positioning object comes into the focus range of the visual field of the camera; detecting a second positional data representing a position of the liquid crystal display based on a monitoring of the second positioning object; correcting a mutual positional relationship between the tape carrier package and the liquid crystal display in the horizontal direction based on the first and second positional data; and lowering the tape carrier package downward so that the tape carrier package is mounted onto the liquid crystal display.

In the above second aspect mounting method, it is desirable that the first positional data and the second positional data are compared with predetermined ideal data, for detecting a horizontal deviation between the tape carrier package and the liquid crystal display. And, at least either the tape carrier package or the liquid crystal display is shifted in the horizontal direction to correct the mutual positional relationship.

Furthermore, a third aspect of the present invention provides an apparatus for mounting a tape carrier package onto a liquid crystal display, comprising: a camera for taking images of a first positioning object on a tape carrier package and a second positioning object on a liquid crystal display; first shifting means for removing a liquid crystal display out of a visual field of the camera in a horizontal direction; second shifting means for shifting the tape carrier package until the first positioning object comes in a focus range of the visual field of the camera; dislocation detecting means for detecting a first horizontal dislocation of the first positioning object on the tape carrier package based on the image of the first positioning object taken by the camera; the second shifting means lifting the tape carrier package upward in a vertical direction so that the tape carrier package goes out of the focus range of the camera; the first shifting means shifting the liquid crystal display in the horizontal direction so that the second positioning object comes into the focus range of the visual field of the camera; the dislocation detecting means detecting a second horizontal dislocation of the second positioning object on the liquid crystal display based on the image of the second positioning object taken by the camera; correcting means for correcting a mutual positional relationship between the tape carrier package and the liquid crystal display in the horizontal direction, by comparing the first and second horizontal dislocations with predetermined ideal data; and the second shifting means lowering the tape carrier package downward so that the tape carrier package is mounted onto the liquid crystal display.

In the third aspect mounting apparatus, it is desirable that the first shifting means is an X-Y table which supports the liquid crystal display and is shiftable in the horizontal direction, and the second shifting means is a Z-axis motor which holds the tape carrier package and is shiftable in the vertical direction. And, the correcting means corrects the mutual positional relationship between the tape carrier package and the liquid crystal display by shifting the first shifting means in the horizontal direction.

Moreover, a fourth aspect of the present invention provides an apparatus for mounting a tape carrier package onto a liquid crystal display, wherein a horizontal dislocation between a first positioning object on the tape carrier package and a second positioning object on the liquid crystal display is checked and corrected before the tape carrier package is mounted onto the liquid crystal display, the apparatus comprising: a camera having an optical axis extending upward along a mirror cylinder connected to an upper face thereof; a light source supplying light into the mirror cylinder via an optical fiber, the light being emitted upward through the mirror cylinder and used to monitor the first positioning object on the tape carrier package and the second positioning object on the liquid crystal display; an X-Y table for shifting the liquid crystal display along a horizontal plane; a Z-axis motor for shifting the tape carrier package in a vertical direction; an X-Y table drive for actuating the X-Y motor; a Z-axis motor drive for actuating the Z-axis motor; a dislocation detector for detecting the horizontal dislocation between the first positioning object on the tape carrier package and the second positioning object on the liquid crystal display; and a controller for controlling the X-Y table drive and the Z-axis drive so as to alternately bring the first and second positioning objects within a focus range of the camera to detect each horizontal dislocation of the first and second positioning objects, and adjusting a mutual positional relationship between the tape carrier package and the liquid crystal display based on the horizontal dislocation detected though the dislocation detector before mounting the tape carrier package onto the liquid crystal display.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENT

Figure 1:
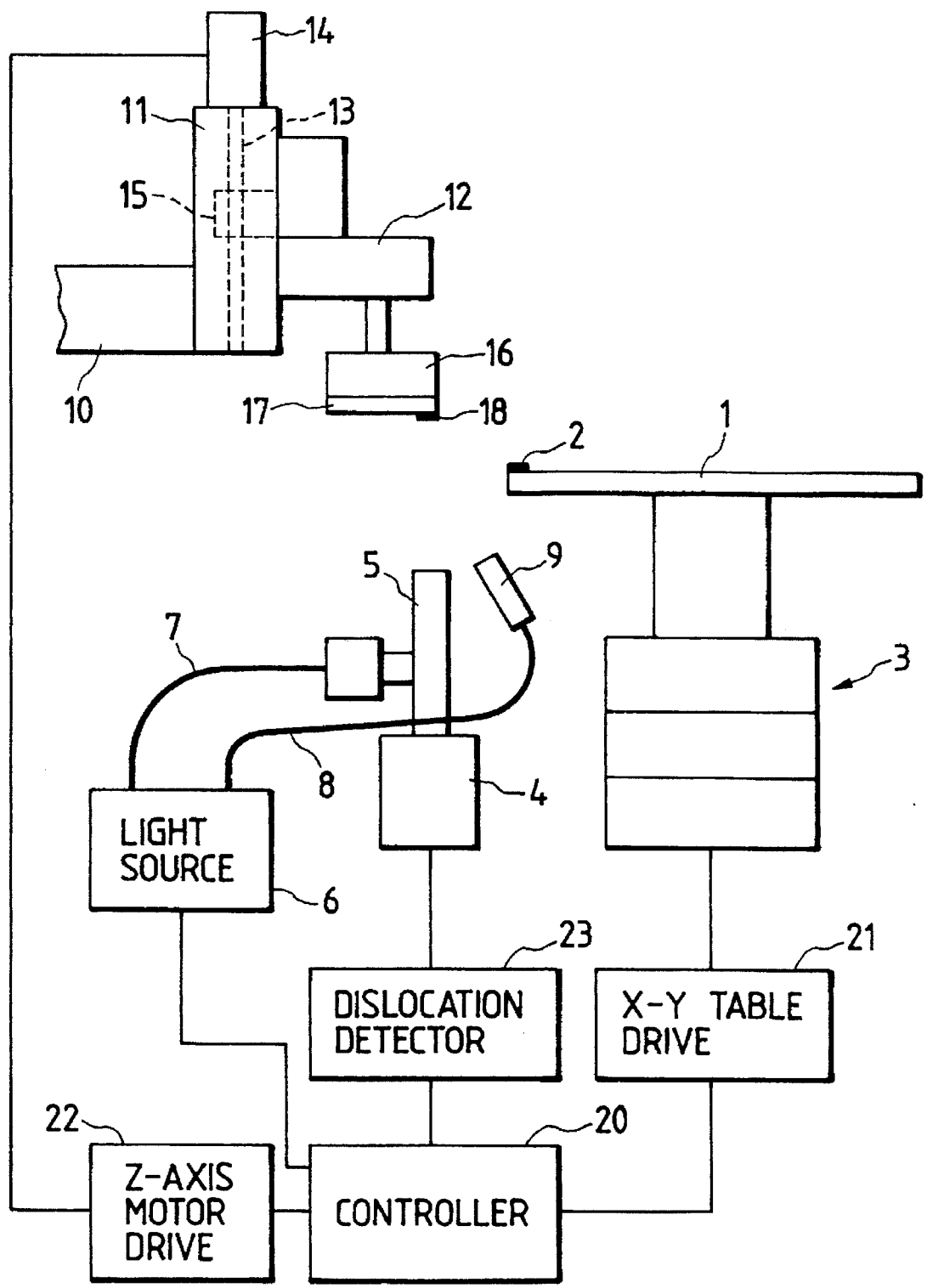
FIG. 1 is a schematic view showing a tape carrier package mounting system in accordance with one embodiment of the present invention.

A preferred embodiment of the present invention will be explained in greater detail hereinafter, with reference to the accompanying drawings. Identical parts are denoted by identical reference numeral throughout views.

FIG. 1 is a schematic view showing a tape carrier package mounting system in accordance with one embodiment of the present invention.

Figure 2:
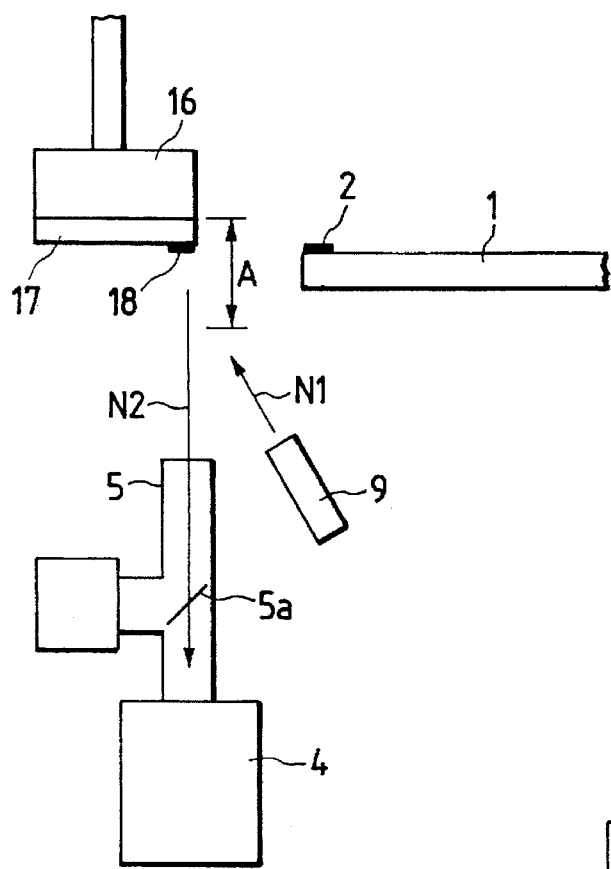
FIG. 2 is a view illustrating an operation of the tape carrier package mounting system in accordance with the embodiment of the present invention.

In FIG. 1, reference numeral 1 represents a liquid crystal display (i.e. LCD). A positioning object 2, such as an electrode or a mark, is provided on the upper surface of the LCD 1. Reference numeral 3 represents an X-Y table which mounts the LCD 1 on the upper face thereof, and shifts the LCD 1 along a horizontal plane, i.e. both in X and Y directions. Reference numeral 4 represents a camera, and reference numeral 5 represents a mirror cylinder connected to the camera 4 and extending upward from the upper face of the camera 4. Reference numeral 6 represents a light source, and reference numeral 7 represents an optical fiber supplying light emitted from the light source 6 into an inside space of the mirror cylinder 5. As shown in FIG. 2, the mirror cylinder 5 has an inside hollow space with a half mirror 5a so that the light supplied from the light source 6 via the optical fiber 7 is reflected at the half mirror 5a toward the direction normal to the incident direction thereof and then travels upward along the axis of the elongated cylindrical body of the mirror cylinder 5. The light emitted along the axial direction of the mirror cylinder 5 is used to scan or monitor the positioning object 2 on the LCD 1 by the camera 4. Namely, the mirror cylinder 5 is placed along the optical axis of the camera 4.

Reference numeral 8 represents another optical fiber supplying light from the light source 6 to a lighting portion 9. The light supplied from the lighting portion 9 via the optical fiber 8 is used to scan or monitor a positioning object 18, such as a lead or a positioning mark, provided on a tape carrier package 17.

Figure 5:
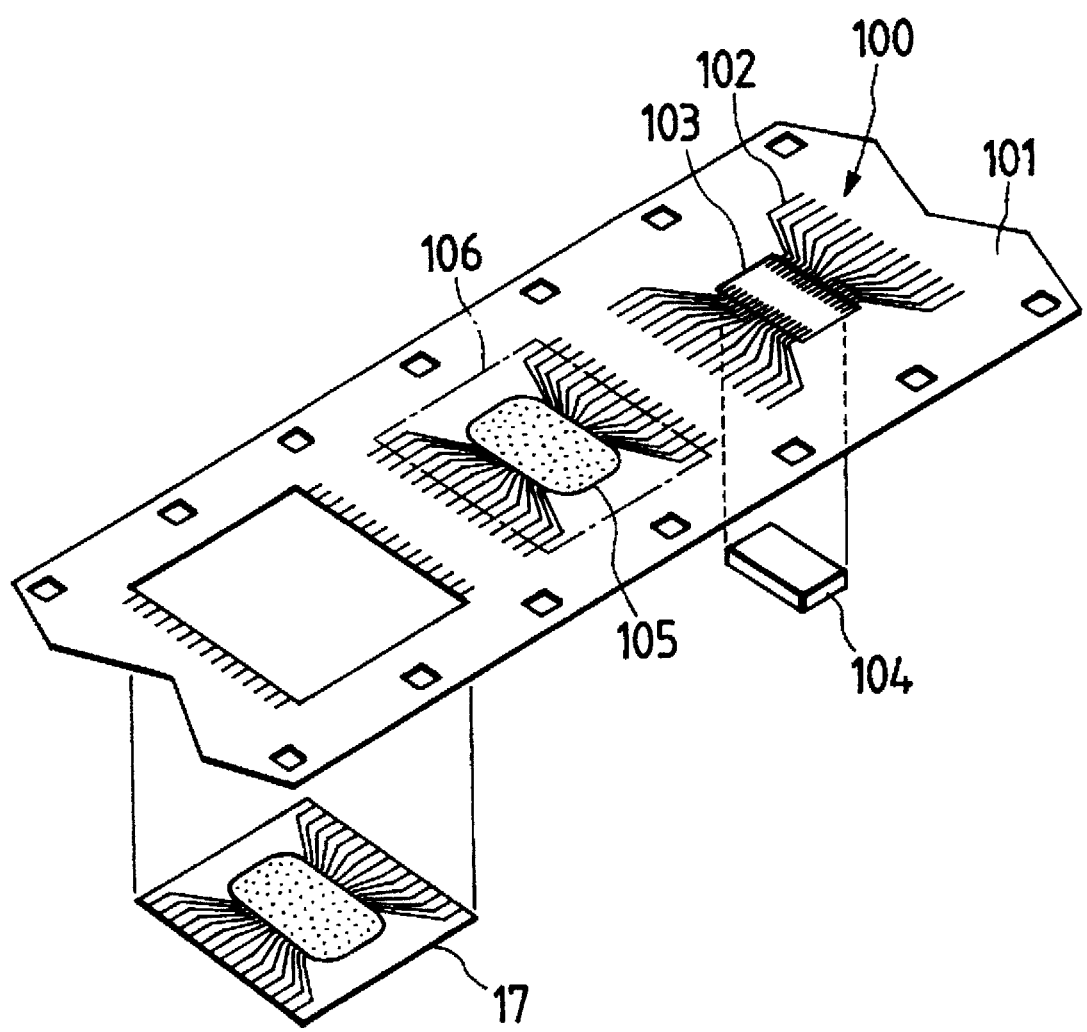
FIG. 5 is a perspective view showing manufacturing processes of a tape carrier package.

Details of the tape carrier package 17 will be explained hereinafter with reference to FIG. 5. The tape carrier package (i.e. TCP) is an electronic component manufactured by the following Tape Automated Bonding method.

First of all, a conductive metallic film 100 (e.g. copper film) is attached or bonded on the surface of a carrier tape 101 made of insulating resin such as polyimide. Then, numerous leads 102 are formed by etching the metallic film 100. One end of each lead 102 overhangs in a device hole 103 opened on the carrier tape 101. Subsequently, a semiconductor chip 104 is mounted in the device hole 103 in such a manner that the electrodes of the semiconductor chip 104 are bonded to the distal ends of overhanging leads 102. For protecting the bonding portions between the leads 102 and corresponding electrodes of the semiconductor chip 104, they are covered by resin coating 105. Thereafter, a rectangular piece including the bonded semiconductor chip 104 therein is separated or taken out by cutting the carrier tape 101 along a cutting line 106 using dies (not shown). Thus, an electronic component called as tape carrier package is obtained.

Returning to FIG. 1, reference numeral 10 represents a shift table, and reference numeral 11 represents a vertically extending box fixed on the front face of the shift table 10. Reference numeral 12 represents a bracket supported and shiftable along the vertically extending front face of the box 11. A vertically extending feed screw 13 is supported in the box 11 so as to be rotatable about its axis. A Z-axis motor 14 with an output shaft protruding downward is fixed on the upper face of the box 11. With actuation of the Z-axis motor 14, the feed screw 13 is rotated. Reference numeral 15 represents a feed nut fixed on the rear face of the bracket 12 and engaged with the feed screw 13. A nozzle 16, extending downward from the lower face of the bracket 12, has a lower surface for absorbing the TCP 17 and holding it horizontally. Accordingly, after the shift table 10 is stopped, the Z-axis motor 14 is driven so as to rotate the feed screw 13, thereby elevating and lowering the TCP 17 in the vertical direction without changing the X-Y position thereof.

Reference numeral 20 represents a controller, constituted by a CPU or the like, for controlling the TCP mounting system. Reference numeral El represents an X-Y table drive for actuating the X-Y table. Reference numeral 22 represents a Z-axis motor drive for driving the Z-axis motor 14. Reference numeral 23 represents a dislocation detector for detecting dislocation (or deviation) amounts of the positioning object 2 on the LCD 1 and the positioning object 18 on the TCP 17 by processing the images obtained by the camera 4 based on pattern matching or the like.

An operation of the TCP mounting system as constituted above will be next explained with reference to the views of FIGS. 2 and 3 and the flow chart shown in FIG. 4.

First, in step S1, the controller 20 sends a drive signal to the X-Y table drive 21 to drive the X-Y table 3 in a horizontal direction. Then, in step S2, it is checked as to whether or not the LCD 1 goes out of the visual field of the camera 4. If the answer of step S2 is "NO", the controller 20 repeats the step S1 until an "YES" answer is obtained in the step S2. On the other hand, if the answer of step S2 is "YES", the controller 20 proceeds to the next step S3 wherein the shift table 10 is moved in the horizontal direction. Then, in step S4, it is judged whether or not the positioning object 18 of the TCP 17 is located above the camera 4. Namely, the TCP 17 held by the nozzle 16 is shifted in the horizontal direction together with the shift table 10, until the positioning object 18 provided on the lower surface of the TCP 17 is positioned just above the mirror cylinder 5, thereby locating the positioning object 18 of the TCP 17 within a focus range "A" (shown in FIG. 3) of the visual field of the camera 4.

If the answer of step S4 is "NO", the controller 20 repeats the step S3 until the positioning object 18 of the TCP 17 is completely located within the focus range "A" of the visual field of the camera 4. On the other hand, if the answer of step S4 is "YES", the controller 20 proceeds to the next step S5. Once the positioning of the shift table 10 is completed through the above steps S3 and S4, the position of the shift table 10 is no longer changed unless the mounting operation of the TCP 17 (later described) is completed.

Next, in the step S5, the controller 20 turns on the light source 6 to emit light upward obliquely (in a direction of an arrow "N1") via the optical fiber 8 and the lighting portion 9. Thus emitted light is used to light up the positioning object 18 of the TCP 17. The light is then reflected toward multiple directions from the rough surface of the positioning object 18 of the TCP 17, with some light entering into the mirror cylinder 5 along an arrow N2. The reflected light introduced into the mirror cylinder 5 then penetrates the half mirror 5a and enters into the camera 4. In step S6, the camera 4 outputs an image of the positioning object 18 of the TCP 17 based on the reflected light, and the image is then analyzed to obtain positional data representing the positioning object 18. The dislocation detector 23 obtains a dislocation (or deviation) of the positioning object 18 of the TCP 17 based on a comparison between the actually detected position and a predetermined ideal position. Thus, obtained dislocation data is sent from the dislocation detector 23 to the controller 20. (Step S7)

Figure 3:
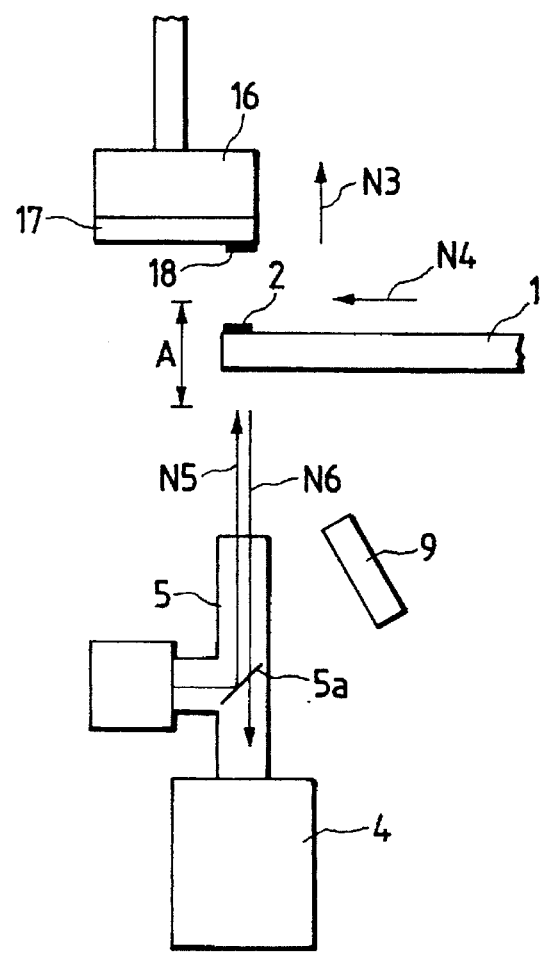
FIG. 3 is a view illustrating an operation of the tape carrier package mounting system in accordance with the embodiment of the present invention.
Figure 4:
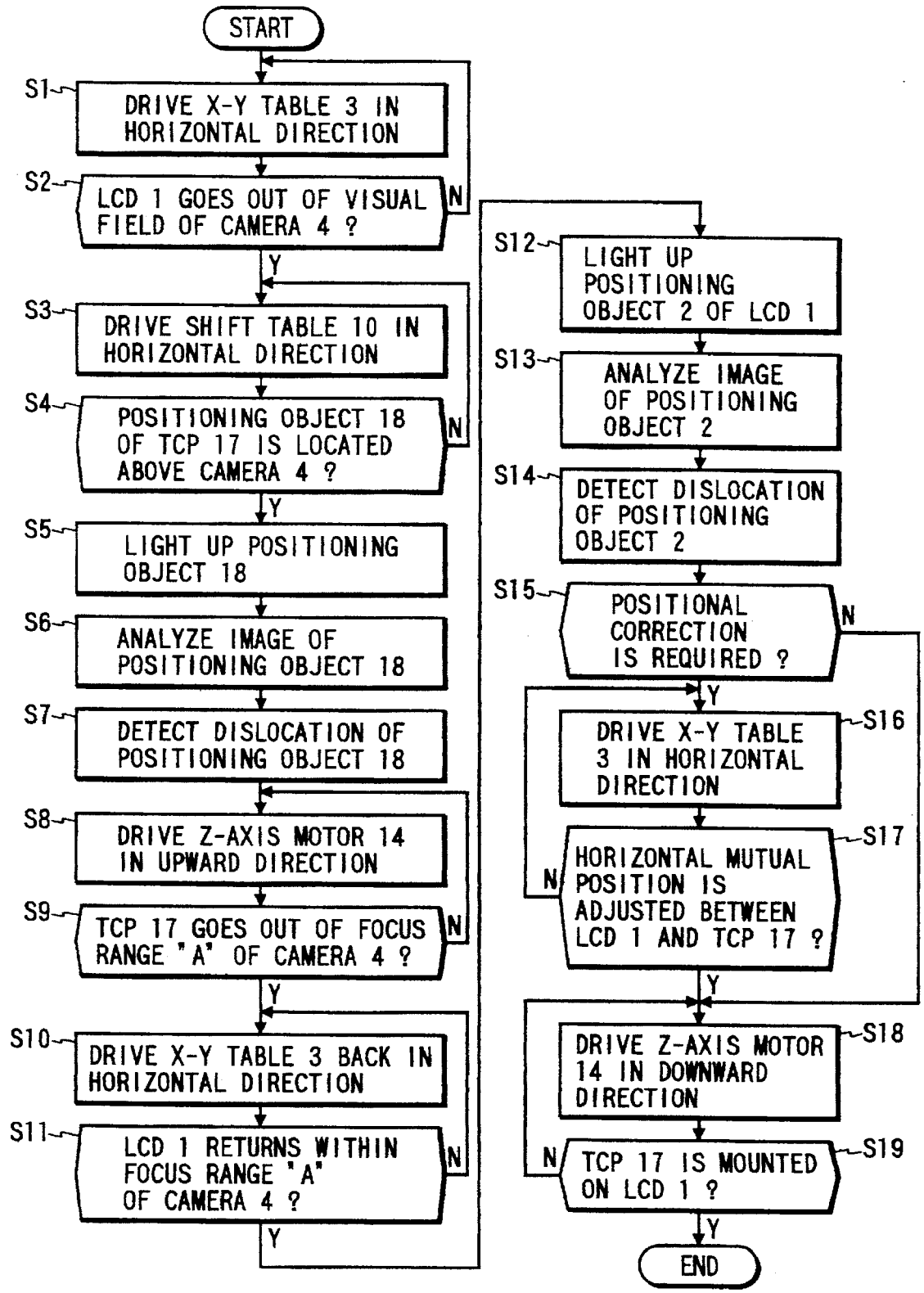
FIG. 4 is a flow chart showing an operation of the TCP mounting system in accordance with the embodiment of the present invention.

Next, in step S8, the controller 20 sends a drive signal to the Z-axis motor drive 22 to actuate the Z-axis motor 14 in a vertical direction, thereby lifting the TCP 17 upward as shown by an arrow N3 in FIG. 3. In the next step S9, it is checked whether the TCP 17 goes out of the focus range "A" of the camera 4. If the answer of step S9 is "NO", the controller 20 repeats the step S8 until "YES" answer is obtained. On the other hand, if the answer of step S9 is "YES", the controller 20 proceeds to step S10. Namely, the TCP 17 needs to be lifted upward until it completely goes out of the focus range "A" of the visual field of the camera 4.

Then, in step S10, the controller 20 sends a drive signal again to the X-Y table drive 21 to drive the X-Y table 3 back in the horizontal direction as shown by an arrow N4. Then, in step S11, it is checked as to whether or not the LCD 1 returns within the focus range "A" of the camera 4. If the answer of step S11 is "NO", the controller 20 repeats the step S10 until a "YES" answer is obtained in the step S11. On the other hand, if the answer of step S11 is "YES", the controller 20 proceeds to the next step S12 wherein the positioning object 2 of the LCD 1 is lighted up by the light supplied from the light source 6 via the optical fiber 7 and the half mirror 5a and emitted in a direction of an arrow N5. The light is then reflected from the surface of the positioning object 2 and returns along a direction of an arrow N6. The reflected light introduced into the mirror cylinder 5 then penetrates the half mirror 5a and enters into the camera 4.

In step S13, the camera 4 outputs an image of the positioning object 2 of LCD 1 based on the reflected light, and the image is then analyzed to obtain positional data representing the positioning object 2 of LCD 1. The dislocation detector 23 obtains a dislocation (or deviation) of the positioning object 2 of the LCD 1 based on a comparison between the actually detected position and a predetermined ideal position. Thus, obtained dislocation data is sent from the dislocation detector 23 to the controller 20. (Step S14)

In the monitoring operation of the positioning object 2 on the LCD 1, the TCP 17 is located on an optical axis (i.e. visual field) of the camera 4. However, the TCP 17 does not give an adverse effect on this monitoring operation, because the TCP 17 is raised so far from the focus range "A" of the camera 4. Thus, it is possible to obtain a noiseless image of the LCD 1.

Next, in step S15, it is judged as to whether or not the positional correction is required in the relation between the LCD 1 and the TCP 17, based on the dislocation values obtained in the steps S7 and S14. In other words, the actual mutual position between the LCD 1 and the TCP 17 in the horizontal direction is compared with a predetermined ideal position in the step S15. More specifically, if any dislocation (or deviation) is detected in the steps S7 and S14, the controller 20 adjusts the mutual position between the LCD 1 and the TCP 17 to realize a predesignated ideal mutual relational relationship.

If the answer of step 15 is "NO", the controller 20 proceeds to step S18. On the other hand, if the answer of step 15 is "YES", the controller 20 proceeds to step 16 to drive the X-Y table 3 in the horizontal (X-Y) direction, thereby adjusting the mutual position between the LCD 1 and the TCP 17. Subsequently, in step S17, it is judged whether or not the adjustment of the mutual position between the LCD 1 and the TCP 17 is completed. If the answer of step S17 is "NO", the controller 20 repeats the step S16 until a "YES" answer is obtained in the step S17. On the other hand, if the answer of step S17 is "YES", the controller 20 proceeds to the next step S18 wherein the controller 20 sends a drive signal to the Z-axis motor drive 22 to actuate the Z-axis motor 14 to lower the TCP 17 downward. Then, in step S19, it is checked whether or not the TCP 17 is mounted on the LCD 1. If the answer of step S19 is "NO", the controller 20 repeats the step S18 until a "YES" answer is obtained. On the contrary, when the answer of step S18 is "YES", the controller 20 ends the mounting operation.

Although the above embodiment is explained based on the LCD 1 shiftable in the horizontal direction, it is, however, possible to move the TCP 17 in the horizontal direction.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method for mounting a tape carrier package onto a liquid crystal display, wherein a first positioning object on said tape carrier package and a second positioning object on said liquid crystal display are monitored by a camera, and said tape carrier package is mounted onto said liquid crystal display after correcting a positional dislocation between said tape carrier package and said liquid crystal display, said method comprising:

a first step of detecting a first positional data representing a position of said tape carrier package based on a monitoring of said first positioning object, said first positioning object of said tape carrier package coming in a focus range of a visual field of the camera after a liquid crystal display is removed out of the visual field of the camera in a horizontal direction;

a second step of detecting a second positional data representing a position of said liquid crystal display based on a monitoring of said second positioning object, said liquid crystal display being shifted in the horizontal direction in such a manner that said second positioning object comes into the focus range of the visual field of the camera after said tape carrier package is lifted upward in a vertical direction until the tape carrier package goes out of the focus range of the camera;

a third step of comparing an actual mutual position with a predetermined ideal position based on said first and second positional data, thereby correcting a mutual positional relationship between said tape carrier package and said liquid crystal display in the horizontal direction; and a fourth step of mounting said tape carrier package onto said liquid crystal display.

2. The mounting method defined by claim 1, wherein said liquid crystal display is held by an X-Y table, and shifted in the horizontal direction by said X-Y table.

3. The mounting method defined by claim 1, wherein said tape carrier package is held by a Z-axis motor shiftable in the vertical direction.

4. The mounting method defined by claim 1, wherein said first positioning object on said tape carrier package is a lead formed on said tape carrier package.

5. The mounting method defined by claim 1, wherein said first positioning object on said tape carrier package is a mark provided on said tape carrier package.

6. The mounting method defined by claim 1, wherein said second positioning object on said liquid crystal display is an electrode formed on said liquid crystal display.

7. The mounting method defined by claim 1, wherein said second positioning object on said liquid crystal display is a mark provided on said liquid crystal display.

8. A method for mounting a tape carrier package onto a liquid crystal display comprising steps of:

providing a first positioning object on a tape carrier package and a second positioning object on a liquid crystal display;

evacuating a liquid crystal display out of a visual field of a camera in a horizontal direction;

shifting said tape carrier package until said first positioning object comes in a focus range of the visual field of said camera;

detecting a first positional data representing a position of said tape carrier package based on a monitoring of said first positioning object;

lifting said tape carrier package upward in a vertical direction until the tape carrier package goes out of the focus range of the camera;

shifting said liquid crystal display in the horizontal direction so that said second positioning object comes into the focus range of the visual field of the camera;

detecting a second positional data representing a position of said liquid crystal display based on a monitoring of said second positioning object;

correcting a mutual positional relationship between said tape carrier package and said liquid crystal display in the horizontal direction based on said first and second positional data; and lowering said tape carrier package downward so that the tape carrier package is mounted onto said liquid crystal display.

9. The mounting method defined by claim 8, wherein said first positional data and said second positional data are compared with predetermined ideal data, for detecting a horizontal deviation between said tape carrier package and said liquid crystal display.

10. The mounting method defined by claim 8, wherein said at least either the tape carrier package or the liquid crystal display is shifted in the horizontal direction to correct the mutual positional relationship.

11. An apparatus for mounting a tape carrier package onto a liquid crystal display, comprising:

a camera for taking images of a first positioning object on a tape carrier package and a second positioning object on a liquid crystal display;

first shifting means for removing a liquid crystal display out of a visual field of said camera in a horizontal direction;

second shifting means for shifting said tape carrier package until said first positioning object comes in a focus range of the visual field of said camera;

dislocation detecting means for detecting a first horizontal dislocation of said first positioning object on said tape carrier package based on the image of said first positioning object taken by said camera;

said second shifting means lifting said tape carrier package upward in a vertical direction so that the tape carrier package goes out of the focus range of the camera;

said first shifting means shifting said liquid crystal display in the horizontal direction so that said second positioning object comes into the focus range of the visual field of the camera;

said dislocation detecting means detecting a second horizontal dislocation of said second positioning object on said liquid crystal display based on the image of said second positioning object taken by said camera;

correcting means for correcting a mutual positional relationship between said tape carrier package and said liquid crystal display in the horizontal direction, by comparing said first and second horizontal dislocations with predetermined ideal data; and said second shifting means lowering said tape carrier package downward so that the tape carrier package is mounted onto said liquid crystal display.

12. The mounting apparatus defined by said claim 11, wherein said first shifting means is an X-Y table which supports said liquid crystal display and is shiftable in the horizontal direction.

13. The mounting apparatus defined by claim 11, wherein said second shifting means is a Z-axis motor which holds said tape carrier package and is shiftable in the vertical direction.

14. The mounting apparatus defined by claim 11, wherein said correcting means corrects the mutual positional relationship between said tape carrier package and said liquid crystal display by shifting said first shifting means in the horizontal direction.

15. An apparatus for mounting a tape carrier package onto a liquid crystal display, wherein a horizontal dislocation between a first positioning object on said tape carrier package and a second positioning object on said liquid crystal display is checked and corrected before said tape carrier package is mounted onto said liquid crystal display, said apparatus comprising:

a camera having an optical axis extending upward along a mirror cylinder connected to an upper face thereof;

a light source supplying light into said mirror cylinder via an optical fiber, said light being emitted upward through said mirror cylinder and used to monitor said first positioning object on said tape carrier package and said second positioning object on said liquid crystal display;

an X-Y table for shifting said liquid crystal display along a horizontal plane;

a Z-axis motor for shifting said tape carrier package in a vertical direction;

an X-Y table drive for actuating said X-Y motor;

a Z-axis motor drive for actuating said Z-axis motor;

a dislocation detector for detecting said horizontal dislocation between said first positioning object on said tape carrier package and said second positioning object on said liquid crystal display; and a controller for controlling said X-Y table drive and said Z-axis drive so as to alternately bring said first and second positioning objects within a focus range of said camera to detect each horizontal dislocation of said first and second positioning objects, and adjusting a mutual positional relationship between said tape carrier package and said liquid crystal display based on the horizontal dislocation detected though said dislocation detector before mounting said tape carrier package onto said liquid crystal display.

* * * * *